(12) United States Patent
Iwamura

(10) Patent No.: US 8,323,752 B2
(45) Date of Patent: Dec. 4, 2012

(54) CARBON-BASED THIN FILM, AND PROCESS FOR PRODUCING THE SAME, AND MEMBER USING THE THIN FILM

(75) Inventor: Eiji Iwamura, Hyogo (JP)

(73) Assignee: Japan Science and Technology Agency, Saitama (JP)

( * ) Notice: Subject to any disclaimer, the term of this patent is extended or adjusted under 35 U.S.C. 154(b) by 1288 days.

(21) Appl. No.: 10/590,105

(22) PCT Filed: Feb. 25, 2005

(86) PCT No.: PCT/JP2005/003203
§ 371 (c)(1),
(2), (4) Date: Jun. 21, 2007

(87) PCT Pub. No.: WO2005/083144
PCT Pub. Date: Sep. 9, 2005

(65) Prior Publication Data
US 2008/0038511 A1    Feb. 14, 2008

(30) Foreign Application Priority Data

Feb. 27, 2004  (JP) ................. 2004-053123
Jul. 5, 2004    (JP) ................. 2004-197877
Jan. 12, 2005   (JP) ................. 2005-005371

(51) Int. Cl.
*B05D 3/00* (2006.01)
*A61N 5/00* (2006.01)

(52) U.S. Cl. ...... 427/551; 427/595; 427/596; 250/492.3

(58) Field of Classification Search .................. None
See application file for complete search history.

(56) References Cited

U.S. PATENT DOCUMENTS
4,619,865 A    10/1986   Keem et al.
(Continued)

FOREIGN PATENT DOCUMENTS
JP            9-309713        12/1997
(Continued)

OTHER PUBLICATIONS

Iwamura E: "Characterization of nanometer-scale columnar and low-density boundary network structures in hydrogenated amorphous carbon films", Ceramic Transactions—Ceramic Nanomaterials and Nanotechnology II, Proceedings of the Symposium held at the 105th Annual Meeting of the American Ceramic Society, Apr. 27-30, 2003, Nashville, TN, US.

(Continued)

*Primary Examiner* — Michael Cleveland
*Assistant Examiner* — Joel Horning
(74) *Attorney, Agent, or Firm* — Hamre, Schumann, Mueller & Larson, P.C.

(57) ABSTRACT

The present invention provides a novel carbon-based material in which carbons different in property are combined in such a manner as to be applicable to a device. The carbon-based thin film provides a carbon-based thin film 10 including first phases 1 that contain amorphous carbon and extend in a film thickness direction, and a second phase 2 that contains a graphite structure and intervenes between the first phases 1. In the thin film, at least one selected from the group consisting of the following a) to e) is satisfied: a) the second phase contains more graphite structures per unit volume than the first phases; b) a density of the second phase is larger than that of the first phases; c) an electric resistivity of the second phase is lower than that of the first phases; d) an elastic modulus of the second phase is higher than that of the first phases; and e) in the second phase, a basal plane of the graphite structure is oriented along the film thickness direction.

9 Claims, 18 Drawing Sheets

U.S. PATENT DOCUMENTS

| | | | |
|---|---|---|---|
| 4,643,951 | A | 2/1987 | Keem et al. |
| 6,251,522 | B1 * | 6/2001 | Tanaka et al. .................. 428/408 |
| 2001/0031346 | A1 | 10/2001 | Iwamura |
| 2002/0061397 | A1 * | 5/2002 | Iwamura et al. .............. 428/334 |
| 2006/0014638 | A1 | 1/2006 | Iwamura |

FOREIGN PATENT DOCUMENTS

| | | |
|---|---|---|
| JP | 2001-106516 | 4/2001 |
| JP | 2002-28483 | 1/2002 |
| JP | 2004261632 A * | 9/2004 |

OTHER PUBLICATIONS

Iwamura E: "Structural ordering of metal-containing amorphous carbon thin films induced by low-energy electron beam projection", Reviews on Advanced Materials Science, vol. 5, No. 3, Dec. 2003, pp. 166-170, XP002622984, Institute of Problems of Mechanical Engineering [RU] ISSN: 1605-8127.

Patsalas, et al., Polycrystalline diamond formation by post-growth ion bombardment of sputter-deposited amorphous carbon films, Carbon, vol. 37, pp. 865-869, 1999.

Patsalas, et al., "Crystallization effects and diamond formation in amorphous carbon films under low energy ion beam irradiation", Nuclear Instruments and Methods in Physics Research Section B: Beam Interactions with Materials and Atoms, vol. 178, issues 1-4, pp. 247-251, 2001.

* cited by examiner (a) after electron beam irradiation (b) before electron beam irradiation (c) sputtered a-C film (a) surface unevenness (b) cos image hard
soft (a) surface unevenness (b) cos image

CARBON-BASED THIN FILM, AND PROCESS FOR PRODUCING THE SAME, AND MEMBER USING THE THIN FILM

TECHNICAL FIELD

The present invention relates to a carbon-based thin film and a process for producing the same. Furthermore, the present invention relates to a member using the carbon-based thin film.

BACKGROUND ART

There are various kinds of carbon-based materials whose properties differ greatly corresponding to bonding configurations of carbons. These carbon-based materials include new materials of which superior properties have been confirmed and that are expected to be widely used in the field of an electronic device, a hydrogen storage material, and the like, as in the case of a carbon nanotube and fullerene. There has been proposed a process for producing these new carbon-based materials easily and with good reproducibility (for example, JP 9(1997)-309713 A).

In the field of hydrogen absorption, a carbon-based material using amorphous carbon has been proposed. For example, JP 2001-106516 A discloses layer-structured amorphous carbon including carbon crystallites of hydrocarbon, as a material having a large hydrogen storage capacity per volume. JP 2002-28483 A discloses a reactant formed from amorphous carbon and an alkaline metal as a material that can occlude hydrogen easily at around room temperature.

JP 2001-261318 A discloses a multilayer film in which low hardness carbon films containing graphite clusters that have an average size of 2 nm or more, and high hardness carbon films containing graphite clusters that have an average size of 1 nm or less are laminated alternately. This multilayer film can be used as a coating film for various members that has improved wear resistance and frictional performance.

DISCLOSURE OF INVENTION

Although being similarly constituted of carbon, amorphous carbon has various properties that differ greatly from crystalline carbon. One example is that while graphite is conductive or semi-insulating, the amorphous carbon is insulating. Therefore, when a technology for producing a composite material in which carbons having different properties are combined and that is easily applicable to devices is established, it will be possible to offer a new compound material.

As JP 2001-261318 A discloses, a film obtained by alternately laminating different kinds of carbon-based thin films can be used as a wear resistant coating film that has improved the wear resistance. However, the film still has a problem of a layer separation occurring in the laminated layers. In addition, a combination of materials by lamination cannot arrange regions having different properties such as the electrical property on a film surface.

Therefore, the present invention provides a carbon-based thin film including columnar first phases that contain amorphous carbon and extend in a film thickness direction and a second phase that contains a graphite structure and intervenes between the first phases. In the thin film, at least one selected from the group consisting of the following a) to e) is satisfied:
a) the second phase contains more graphite structures per unit volume than the first phases;
b) a density of the second phase is larger than that of the first phases;
c) an electric resistivity of the second phase is lower than that of the first phases;
d) an elastic modulus of the second phase is higher than that of the first phases; and
e) in the second phase, a basal plane of the graphite structure is oriented along the film thickness direction.

From another point of view, the present invention provides a process for producing a carbon-based thin film. The process includes the following steps of: forming an amorphous carbon-based thin film that includes columnar first phases extending in a film thickness direction, and a second phase intervening between the first phases; and forming a graphite structure at least in the second phase by supplying energy to the amorphous carbon-based thin film.

In the carbon-based thin film of the present invention, the first phases containing amorphous carbon extend in the thickness direction of the thin film, and the second phase containing a graphite structure intervenes between the first phases. Since amorphous carbon and graphite differ greatly in electrical, optical, mechanical, and other properties, this thin film has a characteristic structure in which phases different in various properties extend along the thickness direction of the thin film. This structure is useful for various devices such as an electric device, and an optical device in which regions that are different in property should be arranged in the in-plane direction of the thin film. This structure easily can be applied to existing thin film devices due to its film shape. As described later, by combining phases that differ in mechanical property, a film that is not hard and yet excellent in wear resistance can be provided. In addition, according to a producing process of the present invention, the above-described carbon-based thin film can be produced easily and effectively without applying special conditions such as high temperature, high vacuum, and the like.

DESCRIPTION OF THE INVENTION

Figure 1:
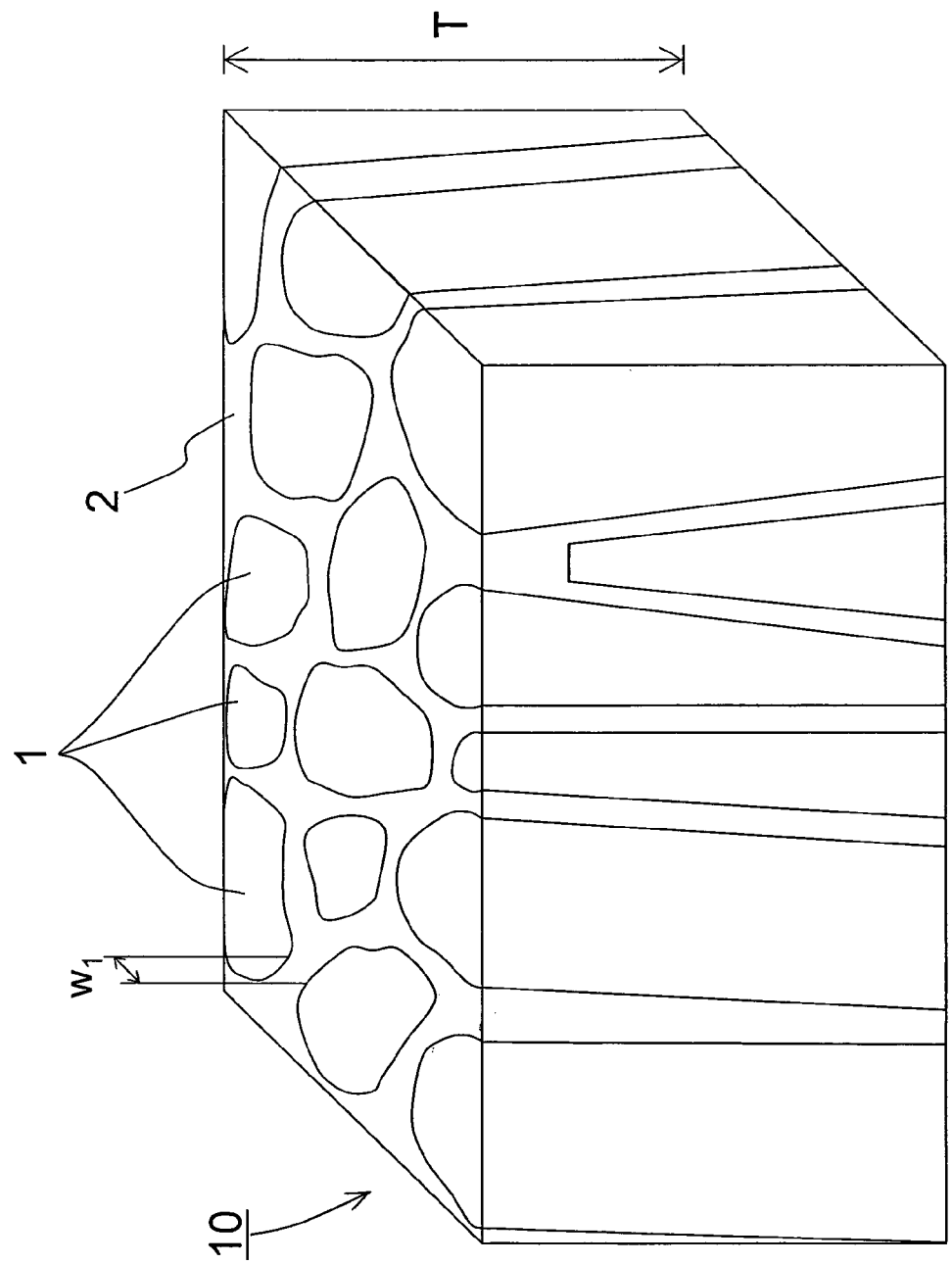
FIG. 1 is a partially cutaway perspective view showing one example of a carbon-based thin film of the present invention.

FIG. 1 shows one example of a carbon-based thin film of the present invention. In this carbon-based thin film 10, columnar first phases 1 extend in the thickness direction of a film, and a second phase 2 intervenes between the first phases 1. This thin film 10 has a so-called column-intercolumn structure, and is composed of a column phase (first phase) containing amorphous carbon and an intercolumn phase (second phase) containing a graphite structure.

Although both the first phases 1 and the second phase 2 are made of a carbon-based material, these two are different phases and have different properties. Microscopically, the two phases may include the same structure, and the first phases 1 may contain the graphite structure, for example. However, generally, compared to the first phases 1, the second phase 2 has a higher structural orderliness and contains more graphite structures. The first phases 1 and the second phase 2 differ in various properties, which is caused mainly by a difference in amount of graphite structure. The second phase 2 also may contain amorphous carbon. Both the first phases 1 and the second phase 2 may be generally classified as amorphous as long as the two phases can be distinguished as different phases having different properties.

In the thin film 10, the density of the second phase 2 is often larger than that of the first phases 1. Although the degree of the density difference of the two phases is not particularly limited, the density of the second phase 2 can be enhanced by approximately 20% with respect to the density of the first phases 1. The elastic modulus of the second phase 2 is preferably equal to or higher than that of the first phases 1. More preferably, the elastic modulus of the second phase 2 exceeds that of the first phases 1.

In addition, by using the conductivity of graphite, the electric resistivity of the second phase 2 can be set lower than that of the first phases 1. For example, while the first phases 1 are maintained as insulating, the second phase 2 can be made semi-insulating or conducting.

On the surface of the thin film 10, island first phases 1 are exposed, and the second phase 2 forms a network between the first phases 1. Thus, the application of the present invention provides a carbon-based thin film having a surface on which two phases are embedded intimately. For example, in an in-plane direction of the thin film 10, the first phases 1 may be minute to the extent that the average size thereof is 300 nm or less, particularly 100 nm or less, and more particularly 1 nm to 50 nm.

The second phase 2 may be one continuous phase as FIG. 1 shows, or two or more phases that are separated from each other. Although the area ratio of the second phase 2 in the in-plane direction of the thin film 10 is not particularly limited, the area ratio, more specifically, the area ratio of the second phase 2 to the total area of the first phases 1 and the second phase 2 preferably may be 1% to 50%, preferably 5% to 30%.

According to the present invention, the first phases 1 can be arranged densely to the extent that in the in-plane direction of the film, an average spacing w1 between a pair of adjacent phases selected from the first phases 1 is 50 nm or less. When the spacing of the first phases 1, that is, the width of the second phase 2, is limited, basal planes ((001) planes) of the graphite structures easily are arranged along the thickness direction of the thin film, not along the in-plane direction, that is, <001> axes of the structures easily are arranged along the in-plane direction.

When the wear resistance of the thin film 10 should be utilized, the film may be formed so that T/W>10 is satisfied, where T is a thickness of the film, and W is an average of the spacings w1 between adjacent two phases selected from the first phases 1 in the in-plane direction of the film.

The average size of the first phases, the area ratio of the second phase, and the spacings of the adjacent first phases in the in-plane direction of the carbon-based thin film can be evaluated with a transmission electron microscope (TEM) as described later.

In the carbon-based thin film of the present invention, in the second phase, the basal plane of the graphite structure preferably is oriented along the film thickness direction. This orientation improves a mechanical property of the thin film, and is advantageous in enhancing abrasion resistance and wear resistance. When the carbon-based thin film has a structure of columnar phases (first phases) containing amorphous carbon with a network intercolumn phase (second phase) in which the basal planes of graphite structures are oriented along the film thickness, the carbon-based thin film is elastic and has excellent wear resistance due to its elasticity. This carbon-based thin film is obtainable by forming an amorphous carbon-based thin film so that a second phase forms a network between the first phases, and subsequently, irradiating an electron beam having appropriate energy onto the thin film, for example. The above-described orientation of the graphite structures plays a great role in decreasing the electric resistivity of the second phase in the film thickness direction.

The present invention can provide a thin film 10 that satisfies at least one of, preferably a plurality of, and more preferably all of the above-described conditions of a) to e). In conventional column-intercolumn structures just as it was formed, columnar phases (first phases before energy supply) have a relatively large density while an intercolumn phase (second phase before energy supply) has a relatively small density and intervenes between the columnar phases. In a state where energy is not yet supplied, the column phases contain more graphite structures per unit volume than the intercolumn phase, and the elastic modulus of the column phases is higher than that of the intercolumn phase.

In this description, a "carbon-based thin film" means that its main component is carbon, more specifically, the content of carbon (C) is 50 atom % or more. Thus, in this description, the addition of "-based" means that the content of the component is 50 atom % or more.

The thin film 10 further may contain atoms other than carbon, for example, at least one selected from the group consisting of hydrogen, nitrogen, boron, and silicon. For example, the addition of hydrogen increases an electrically insulating property in the column phases (first phases), and also widens an optical band gap. As a result, a difference in electrical and optical properties between the column phases (first phases) and the intercolumn phase (second phase) containing the graphite structures can be wider. Although the content of the other atoms such as hydrogen in the thin film 10 is not particularly limited, the content may be 0.1 atom % to less than 50 atom %.

In this description, the "amorphous" carbon means that the carbon does not have a periodic long range order (structural order) as a crystal and includes so-called noncrystalline carbon, diamond-like carbon, and glass-like carbon (there is no definite distinction between these terms). Both the first phases 1 and the second phase 2 may be constituted of amorphous-based carbon. The second phase 2 may be constituted of crystalline-based carbon.

Although not particularly limited, the thickness of the thin film 10 may be in a range of 1 nm to 5 μm, and particularly in a range of 10 nm to 1 μm, for example. When the thin film 10 is too thick, a defect such as a pore easily forms in the second phase of the thin film 10 in a film formation step (amorphous film forming step) described later. There is a tendency that the thicker the film, the larger both the average size (column size) of the first phases and the spacing (intercolumn distance) of the first phases.

In addition to a region having the first phases 1 and the second phase 2, the carbon-based thin film of the present invention may include other regions. For example, a carbon-based thin film 20 shown in FIG. 11 includes a first region 11 that has the first phases 1 and the second phase 2 and a second region 12 that has columnar third phases 3 that contains amorphous carbon and extend in the film thickness direction and a fourth phase 4 that contains amorphous carbon and intervenes between the third phases 3. Both the third phases 3 and the fourth phase 4 may be constituted of amorphous-based carbon.

The carbon-based thin film 20 can be made by selectively supplying energy to the amorphous carbon-based thin film having a column-intercolumn structure. In this case, a portion to which the energy is selectively supplied is the first region 11, and in the second region 12, columnar phases just as they were formed exist as the third phases 3 and an intercolumn phase just as it was formed exists as the fourth phase 4. When the energy is supplied selectively as described above, the first region 11 and the second region 12 can be arranged in the thin film 20 in an arbitrary position and at arbitrary size. The design flexibility of the thin film is quite important upon application to devices.

Both the first region 11 and the second region 12 may have different properties. For example, to reflect that the fourth phase 4 is an intercolumn phase just as it was formed and the second phase 2 is an intercolumn phase modified by the energy supply, at least one of, preferably a plurality of, and more preferably all of the following f) to i) may be satisfied in the carbon-based thin film 20:

f) the second phase contains more graphite structures per unit volume than the fourth phase;

g) the density of the second phase is larger than that of the fourth phase;

h) the electric resistivity of the second phase is lower than that of the fourth phase; and i) the elastic modulus of the second phase is larger than that of the fourth phase.

Furthermore, in the carbon-based thin film 20, the regions 11 and 12 can be formed so that the light transmittance in a wavelength range from a visible range to an infrared range in the first region 11 is lower than that in the same wavelength range in the second region 12. The difference in light transmittance in minute regions can be applicable to optical devices. Specifically, the light transmittance in the wavelength range from 600 nm to 1100 nm in the first region 11 should be lower than that in the same wavelength range in the second region 12. More specifically, regarding each wavelength in the same wavelength range, the light transmittance in the first region 11 is preferably lower than that in the second region 12.

Although the arrangement of the first region 11 and the second region 12 is not limited, at least one of, preferably both of the conditions selected from the following j) to k) are preferably satisfied in the regions 11 and 12:

j) either one of the regions selected from the first region and the second region is a columnar region surrounded by the other region, and the average size in the in-plane direction of this columnar region is 100 nm or more, preferably 200 nm or more; and k) regarding the first in-plane direction, the first region and the second region have the average sizes two or more times larger than, preferably 10 or more times larger than those in the second in-plane direction perpendicular to the first in-plane direction, and regarding the second in-plane direction, the first region and the second region are arranged alternately.

The structure that satisfies the above-described condition of j) or k) cannot be made from the column-intercolumn structure as it was formed even when the film thickness is set large. This is because, in a state as it was formed, the average size of the columnar phases is smaller than that of the above condition j), and the columnar phases are not so elongated as described in the above condition k) in the in-plane direction.

Figure 12:
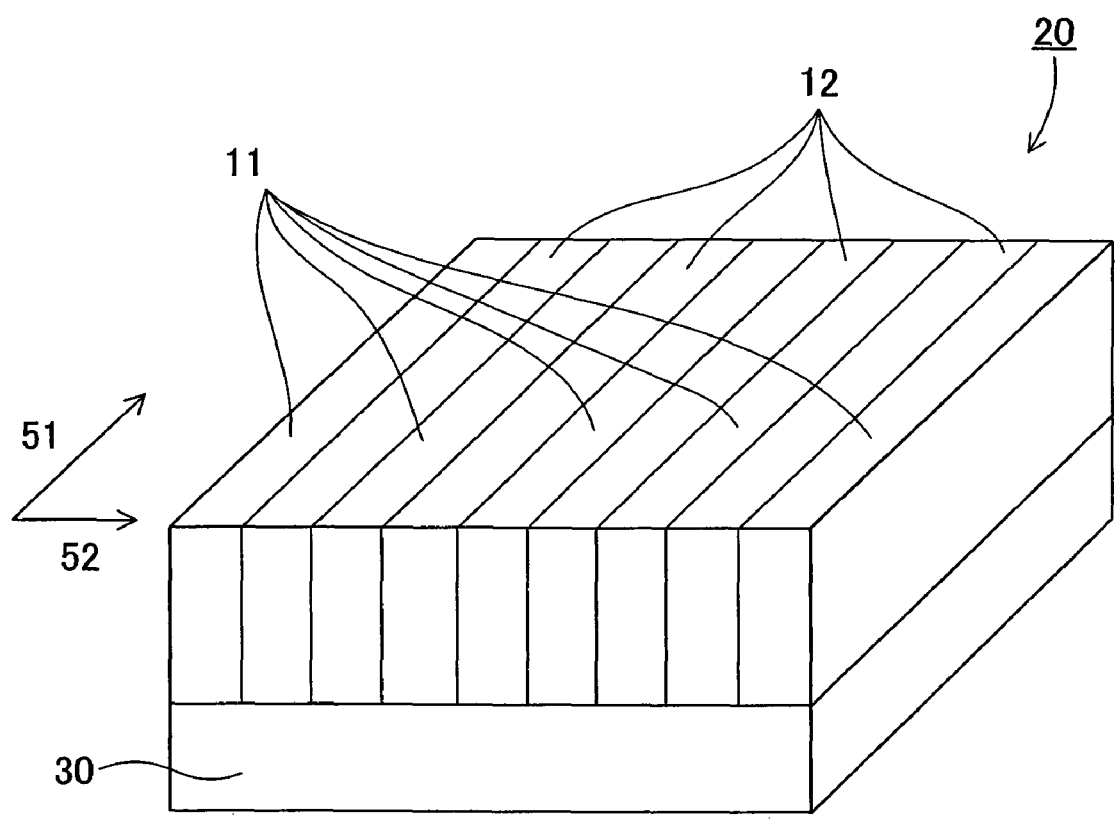
FIG. 12 is a partially cutaway perspective view showing a thin film that includes a first region and a second region as still another example of the carbon-based thin film of the present invention.

In a carbon-based thin film 20 shown in FIG. 12, both the first regions 11 and the second regions 12 are strip-shaped regions. Regarding a first in-plane direction 51, the strip-shaped regions 11 and 12 have average sizes larger than those in a second in-plane direction 52 perpendicular to the direction 51 by a magnification as described in the above-described condition k), and regarding the second in-plane direction, the strip-shaped regions 11 and 12 are arranged alternately.

Figure 13:
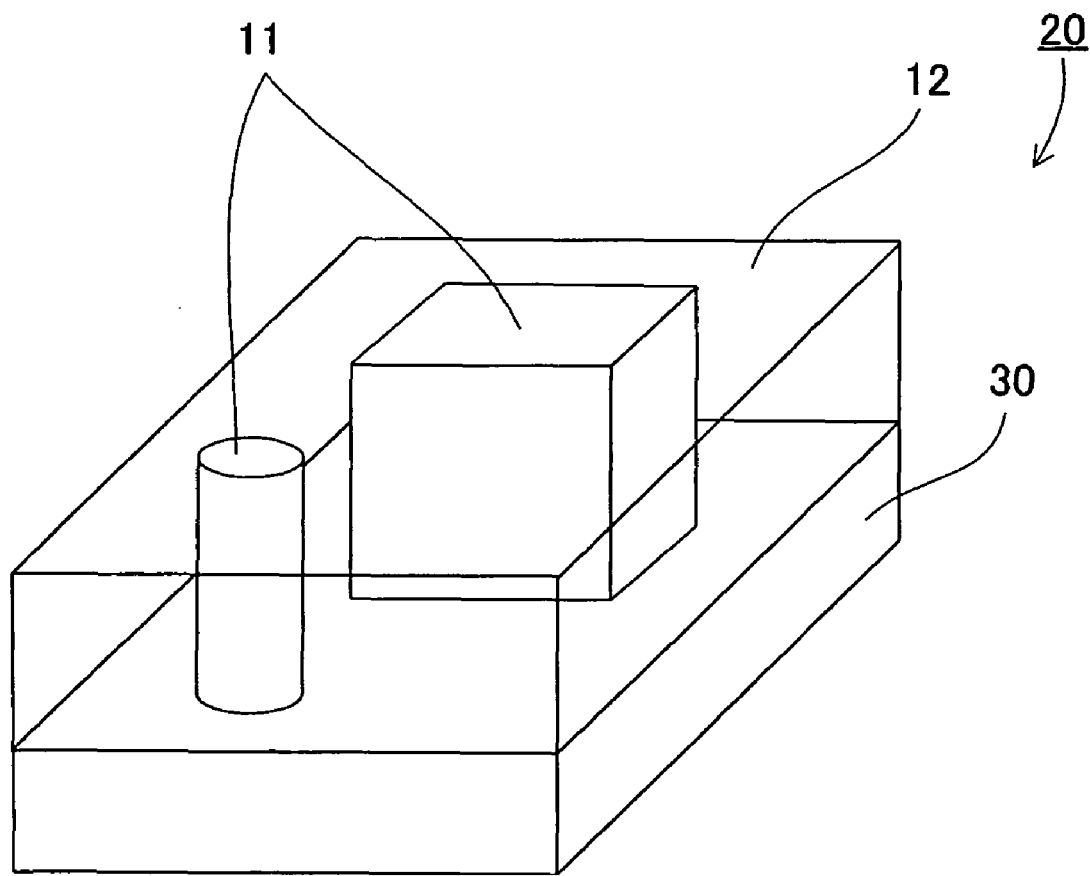
FIG. 13 is a partially cutaway perspective view showing a thin film that includes a first region and a second region as still yet another example of the carbon-based thin film of the present invention.

In a carbon-based thin film 20 shown in FIG. 13, the first region 11 is a columnar region surrounded by the second region 12. Thus, in the carbon-based thin film 20, either one of the regions selected from the first region 11 and the second region 12 may be a columnar region surrounded by the other region. The average size of this columnar region 11 is set so that the above-described condition j) is satisfied. The shape of the columnar region 11 is not limited, and cylindrical or square pole shape as shown in FIG. 13 is an example.

Figure 11:
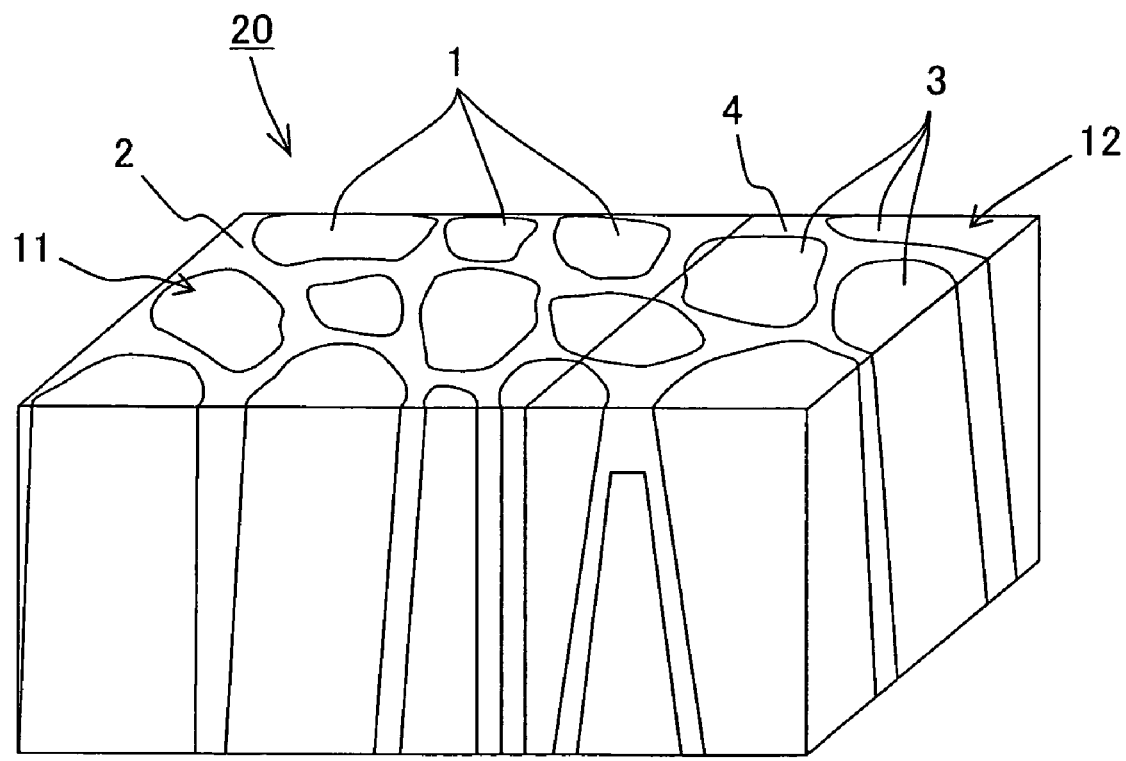
FIG. 11 is a partially cutaway perspective view showing another example of the carbon-based thin film of the present invention.

It should be noted that in FIGS. 12 and 13, the reference numeral 30 denotes a substrate not shown in FIGS. 1 and 11.

In a producing process of the present invention, as described above, the carbon-based thin film 10 was obtained by forming an amorphous carbon-based thin film including two phases (hereinafter, may be referred to as an "amorphous film forming step"), and subsequently, by supplying appropriate energy to this amorphous carbon-based thin film (hereinafter, may be referred to as an "energy supplying step"). In this producing process, two phases are formed in advance in the amorphous film forming step. Thus, even when the energy is supplied to the entire thin film during the energy supplying step, a change induced by the energy supply differs depending on the phase. The energy can be supplied to the entire thin film, and the energy supplying step can be performed easily.

In the amorphous film forming step, the amorphous carbon-based thin film may be formed so that the first phases extend in a columnar shape in the film thickness direction and the second phase intervenes between the first phases in the thin film. For this film formation, a vapor phase deposition method is suitable in which a film formation material is supplied from a gas phase. It is known that the column-intercolumn structure develops by a nonuniform solid phase formation in a vapor phase deposition method. Once the solid phases start forming ununiformly in some sites on a substrate surface, the solid phases preferentially grow at these sites. As a result, columnar phases tend to develop. For making the solid phase formation on the substrate surface nonuniform, the mobility of atoms of the film formation material deposited on the surface should be small. This is because high mobility of the atoms urges a uniform solid phase formation.

The conditions for preventing the mobility of atoms should be appropriately selected according to the film formation method. At least in a physical vapor deposition (PVD) method, which is represented by a sputtering method, a low substrate temperature and a higher atmospheric pressure are preferable conditions. The lower substrate temperature absorbs the thermal energy of the atoms, and the higher atmospheric pressure decreases the kinetic energy of atoms that move toward the substrate.

The substrate temperature is preferably 773K (500° C.) or less. When the substrate temperature exceeds 773K, it is difficult to develop columnar phases and form an amorphous film. The substrate temperature should be 473K (200° C.) or less, and particularly at room temperature or less, for example, 0 to 10° C. (273 to 283K). The substrate temperature has no lower limit, and may be lowered to around the liquid nitrogen temperature (77K).

The atmospheric pressure is preferably 1.33 Pa (10 mTorr) or more, and more preferably 2.00 Pa (15 mTorr) or more. When the atmospheric pressure is lower than 1.33 Pa, the nonuniform solid phase formation hardly occurs. In addition, when the atmospheric pressure is too low, the spacings of the columnar phases become narrow, and it might make it difficult to develop the graphite structures. On the other hand, an excessively high atmospheric pressure raises obstacles in the film formation itself, and thus, the atmospheric pressure should be 6.67 Pa (50 mTorr) or less.

As described above, the amorphous film forming step is preferably performed by a physical vapor deposition method in which at least one of, and preferably both of the conditions A and B are satisfied, where the condition A is that the substrate temperature is 773 K or less, and the condition B is that the atmospheric pressure is 1.33 Pa or more.

In a physical vapor deposition method, the mobility of atoms can easily be controlled, and the method is suitable for the formation of the amorphous carbon-based thin film that has a column-intercolumn structure. Herein, in addition to a sputtering method, examples of the physical vapor deposition method include an ion plating method, an ion beam deposition method, and the like. Although a reactive sputtering method accompanies a chemical reaction, this method also is one of the PVD methods. Therefore, in this description, the term "sputtering method" is used for a film formation method that includes various sputtering methods such as a reactive sputtering deposition method.

A sputtering method is the most appropriate film forming method for practicing the amorphous film formation step of the present invention. According to a sputtering method, a developed columnar phase can be easily obtained and the shape of the columnar phase can be controlled easily. As the Structure Zone Model by Thornton indicates, it is possible to control a microstructure of the film by the substrate temperature and the atmospheric pressure in a sputtering method, and this control method can be applied to the controlling of the column-intercolumn structure of the present invention. Examples of a target for a sputtering method include pyrolytic graphite. When atoms of silicon, boron and the like should be added to the film, a target including those atoms should be used. The atmosphere should be an inactive gas such as argon, and together with the inactive gas, the atmosphere may contain at least one selected from the group consisting of a hydrogen atom-containing gas and a nitrogen atom-containing gas to add hydrogen atoms and/or nitrogen atoms to the film.

Although the material of a substrate for the formation of the thin film is not particularly limited, a substrate of semiconductor such as silicon, a substrate of oxide such as $Al_2O_3$, and MgO, and a substrate of metal such as iron, aluminum and an alloy containing such metals can be appropriately used, for example.

In the amorphous carbon-based thin film formed by the above-described method, the columnar phases (first phases) are generally higher in density than its peripheral area (second phase). The second phase may sometimes be lower in density than the first phases by as much as approximately 10 to 40%.

In the energy supplying step, the energy should be supplied to one of or all portions of the amorphous carbon-based thin film so that while the first phases maintain a state in which the amorphous carbon is contained, the graphite structures are formed in the second phase. Through this step, the graphite structures preferentially generate in the second phase. The generation of the graphite structures (graphitization) is preferably performed in such a manner that a change in property accompanying the graphite generation appears only in the second phase, or that an excessive graphitization in the first phases does not dissipate a difference in property between the first phases and the second phase.

In the second phase, the crystallization progresses more easily and preferentially than the first phases. This is probably because, due to a formation mechanism of the column-intercolumn structure, the second phase forms a low-density amorphous network structure. This structure includes interatom bondings in the second phase that are meta-stable and less stable than those in the first phases, and thus, the energy required for rearrangement of atoms is relatively small in the second phase. Therefore, even when the energy is supplied to the entire thin film from outside, and even when a spatial distribution is not provided to the intensity of the energy, the graphite structure can preferentially generate with the crystallization of carbon in the second phase. It is one of the characteristics of the present invention that a minute spatial distribution need not be provided to the supplying energy for the minutely embedded column-intercolumn structure.

Although the energy supply is not particularly limited, the energy is preferably supplied by an electron beam irradiation. In the electron beam irradiation, unlike a thermal treatment, it is not necessary to heat an entire device, or an entire specimen on which the thin film is formed, and thus the crystallization in the first phases can be prevented. The electron beam irradiation is particularly preferable where the carbon-based thin film is used with another material that has a lower heat resistance.

It should be noted that, when the energy of the electron beam is too high, it becomes difficult to generate the graphite structures in the second phase selectively due to an electron-induced displacement and a heating effect by the electron beam. To avoid this, an electron beam of 100 keV or less, furthermore, 60 keV or less, or 40 to 60 keV, for example, should be used. In addition, the irradiation intensity of the electron beam is preferably $10^{19}/cm^2 \cdot sec$ or less, more preferably $10^{17}/cm^2 \cdot sec$ or less, and most particularly $10^{15}/cm^2 \cdot sec$ or less. Although not particularly limited, the irradiation intensity of the electron beam is preferably $10^{13}/cm^2 \cdot sec$ or more.

Since the electron beam irradiation at high energy is rather not preferable, the electron beam need not be irradiated in a high vacuum condition, and may be irradiated under atmospheric pressure, for example. The processing of the thin film without greatly reducing the pressure will be a great advantage in view of mass production.

The electron beam irradiation may be performed in an oxygen-containing atmosphere such as the air. In this case, however, ozone is generated. To avoid this, the electron beam irradiation should be performed in a non-oxidation atmosphere that is free from oxygen, for example, in an atmosphere made of an inactive gas represented by argon, or of a nitrogen gas.

In the present invention, when the energy is supplied to the amorphous carbon-based thin film with appropriately selecting various conditions as described above, more graphite structures can be formed per unit volume in the second phase than in the first phases. For the preferential formation of the graphite in the second phase, the amorphous carbon-based thin film should be formed so that the density of the second phase is relatively lower than that of the first phases, and that a structural change of the second phase induced by the energy supply is made more likely to occur than the structural change of the first phases.

In addition, in the present invention, by appropriately selecting the conditions as above, the amorphous carbon-based thin film is formed so that the density of the second phase is relatively lower than that of the first phases, and the energy is supplied to the amorphous carbon-based thin film so that with the generation of the graphite structure, the density of the second phase is relatively higher than that of the first phases (that is, so that a magnitude relationship of the density becomes reversed). Furthermore, regarding an amount of the graphite structure per unit volume, the amorphous carbon-based thin film is formed so that the amount of the graphite structure in the second phase is relatively smaller, and the energy is supplied so that the amount of the graphite structure in the second phase is made relatively larger than that in the first phases.

The energy can be supplied when at least one of, preferably a plurality of, and more preferably all of the above conditions selected from the group consisting of a) to e) are satisfied. However, the energy supply does not need to satisfy the at least one condition above in the entire region of the amorphous carbon-based thin film. The energy may be supplied to a portion of the amorphous carbon-based thin film.

Figure 14:
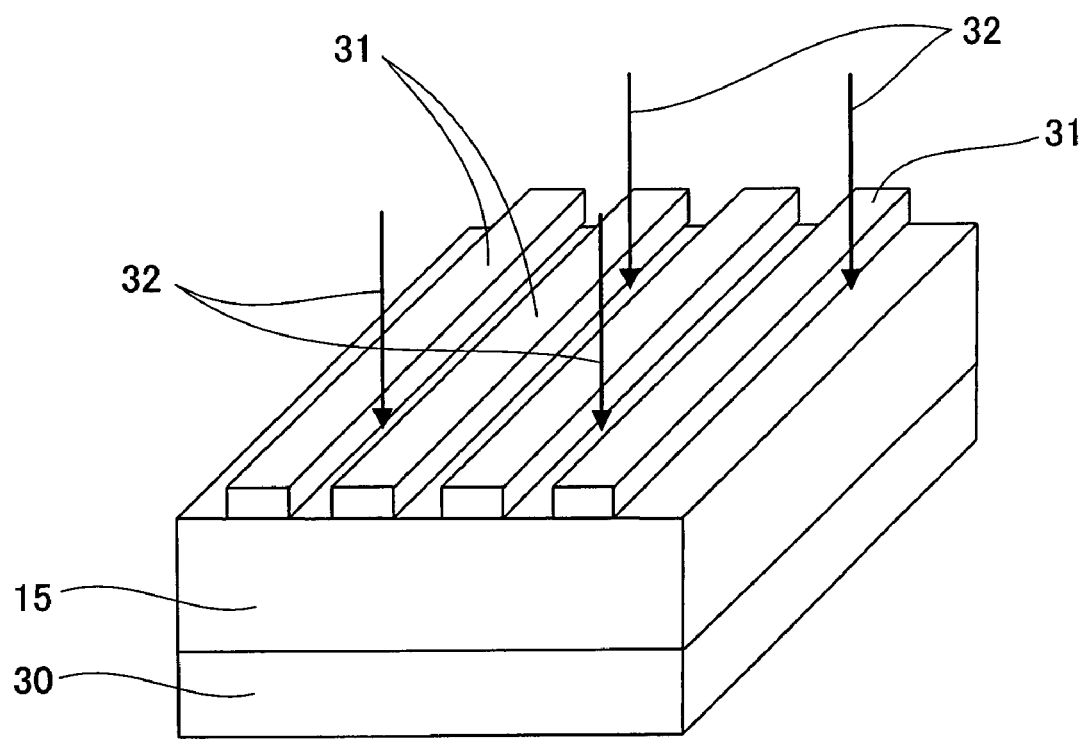
FIG. 14 is a partially cutaway perspective view exemplifying an irradiation method of an electron beam in a producing process of the present invention.

As shown in FIG. 14, while the surface of an amorphous carbon-based thin film 15 formed on a substrate 30 is partially masked by a mask 31, to supply the energy to a portion of the thin film, an electron beam 32 should be irradiated onto this surface. As the mask 31, a plate-like member (template) such as a metal plate, and a resin plate, which are formed previously so as to have a predetermined pattern, may be used. A metal thin film formed so as to have a predetermined pattern also may be used. When the mask 31 having an opening of a predetermined pattern is used, and the electron beam 32 is injected into the thin film through the opening, a region that corresponds to the opening becomes the first region 11 and a masked region becomes the second region 12.

When the energy is supplied selectively to a portion or portions of the amorphous carbon-based thin film having the column-intercolumn structure, the carbon-based thin films 20 as illustrated in FIGS. 11 to 13 can be obtained. Energy supply regions (first regions 11) and energy non-supply regions (second regions 12) may have different properties as described above. Although there are limits in the column-intercolumn structure as to sizes and a degree of freedom in arrangement of the columnar phases and the intercolumn phase, a degree of freedom in design of the above-described two regions 11, 12 is very high.

Because of excellent mechanical, optical, and electrical properties, the carbon-based thin film of the present invention can be applied to a wide range of members. From another point of view, the present invention includes a substrate and a thin film formed on this substrate, and provides a member in which this thin film is the carbon-based thin film of the present invention.

A material of the substrate is not particularly limited, and a metal, a semiconductor, ceramic, glass, or resin can be used as examples. The shape of the substrate also is not particularly limited. The substrate can be a plate, a column, a cone, and the like.

Figure 16:
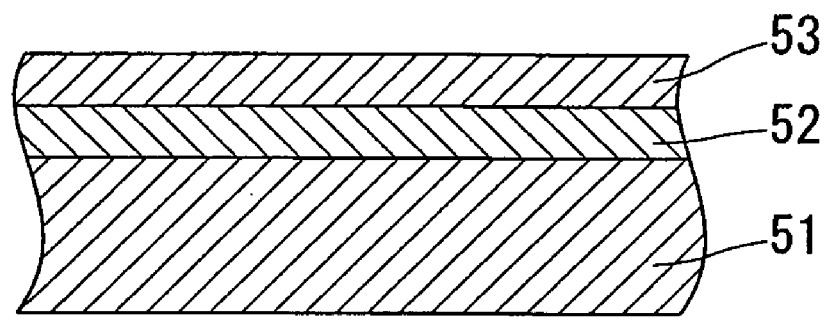
FIG. 16 is a sectional view showing one example of a member including a carbon-based thin film of the present invention.

As FIG. 16 shows, for a purpose of improving adhesiveness between a substrate 51 and a carbon-based thin film 53, an intermediate film 52 may be arranged between the substrate 51 and the carbon-based thin film 53. As a material of the intermediate film 52, a mixture of a metal and carbon, a metal nitride, a metal carbonitride, and the like can be used.

The carbon-based thin film of the present invention has high wear resistance, and since the carbon-based thin film is composed mainly of carbon, the friction coefficient is small and the adherence is low. In order to utilize such excellent properties, the carbon-based thin film of the present invention may be formed on the surface of a substrate to be in contact with another member. The member thus obtained has excellent properties as a sliding member. Herein, the sliding member refers to a member that slides with another in use such as a movable component represented by a toothed wheel, various kinds of tools, a magnetic head, for example.

The carbon-based thin film of the present invention may be formed on the surface of a molding die. The molding die is used for molding a molded material, such as resin and glass, into a predetermined shape. Conventionally, in a die for molding an information recording medium such as a compact disk (CD), for example, a die life has been prolonged by forming a diamond-like carbon thin film in a portion where a stamper is supported. However, on the surface of a semi-insulating or insulating diamond-like carbon thin film, there is a problem in that dust and dirt are deposited on the surface due to its charging. The carbon-based thin film of the present invention can prevent the deterioration of the die and the charging on the surface of the die.

Figure 17:
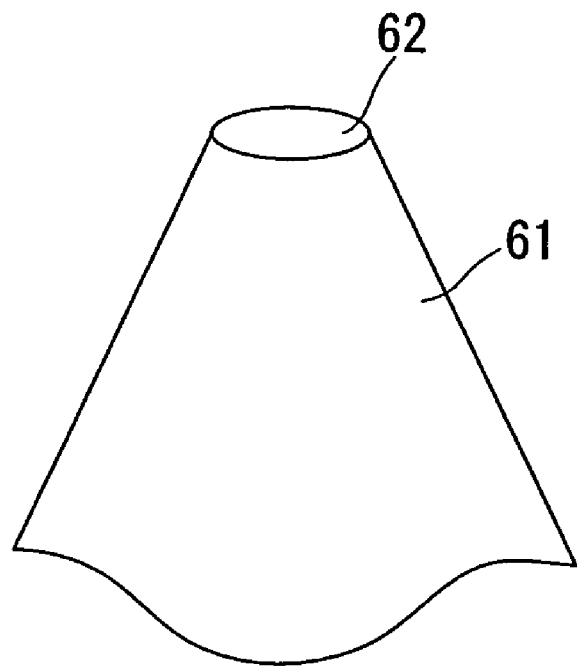
FIG. 17 is a partial perspective view showing another example of a member including a carbon-based thin film of the present invention.

Due to its conductivity, the carbon-based thin film of the present invention can be formed on the surface of an electrical contact terminal. Herein, the electrical contact terminal refers to a terminal in which a predetermined function is demonstrated when making an electric contact with another member. Examples of the electrical contact terminal include various probes such as a contact probe of a semiconductor inspection apparatus. As FIG. 17 shows, the carbon-based thin film of the present invention is at least formed in a contact portion 62 of the tip end of an electrical contact terminal (contact probe) 61. As a material of the probe, various conventionally used materials, metals such as tungsten, and a semiconductor represented by silicon may be used.

When metal is doped simply in a conventional carbon film, a conductive carbon-based thin film can be obtained. However, the carbon-based thin film thus obtained does not have sufficient hardness and wear resistance. On the contrary, the carbon-based thin film of the present invention easily can satisfy both of the conductivity and the wear resistance.

Members such as a gear, a toothed wheel, and an actuator, in which the carbon-based thin film of the present invention is used, also are effective in a micro system such as a so-called micro machine or MEMS (micro electro mechanical systems).

Hereinafter, the present invention will be described in more detail by referring to examples. However, the following illustrate embodiments of the present invention as in the above-described descriptions in this section, and the present invention is not limited thereby.

Example 1

By using a magnetron sputtering method, an amorphous carbon-based thin film of approximately 0.5 μm in film thickness was formed on a silicon substrate. Pyrolytic graphite was used as a target. A substrate temperature was set at room temperature, and an atmospheric pressure was set to 2 Pa (15 mTorr). A film formation atmosphere was a mixed gas of argon and methane. The flow ratio between argon and methane was adjusted to 8:2.

An electron beam was irradiated onto the amorphous carbon-based thin film thus obtained. The electron beam irradiation was performed by using an electron beam accelerated at 60 kV-0.3 mA with an irradiation intensity of $1\times10^{14}/cm^2\cdot sec$ in an atmosphere depressurized to $1.3\times10^{-3}$ Pa. An apparatus used for irradiating the electron beam was an electron beam irradiation tube ("Min-EB" manufactured by Ushio Inc). The electron beam had its energy decreased by approximately 10 to 20% by passing through a Si window, and while the electrons were in a dispersed state, the amorphous carbon-based thin film was exposed to the electron shower. The spacing between the Si window and the amorphous carbon-based thin film was set to 15 mm. An irradiation time was from 1 minute to 5 hours and 30 minutes. It should be noted that a temperature rise of the thin film that accompanied the electron beam irradiation was saturated at 453 K according to a measurement with a thermal coupling. This saturation took 30 minutes.

Figure 2:
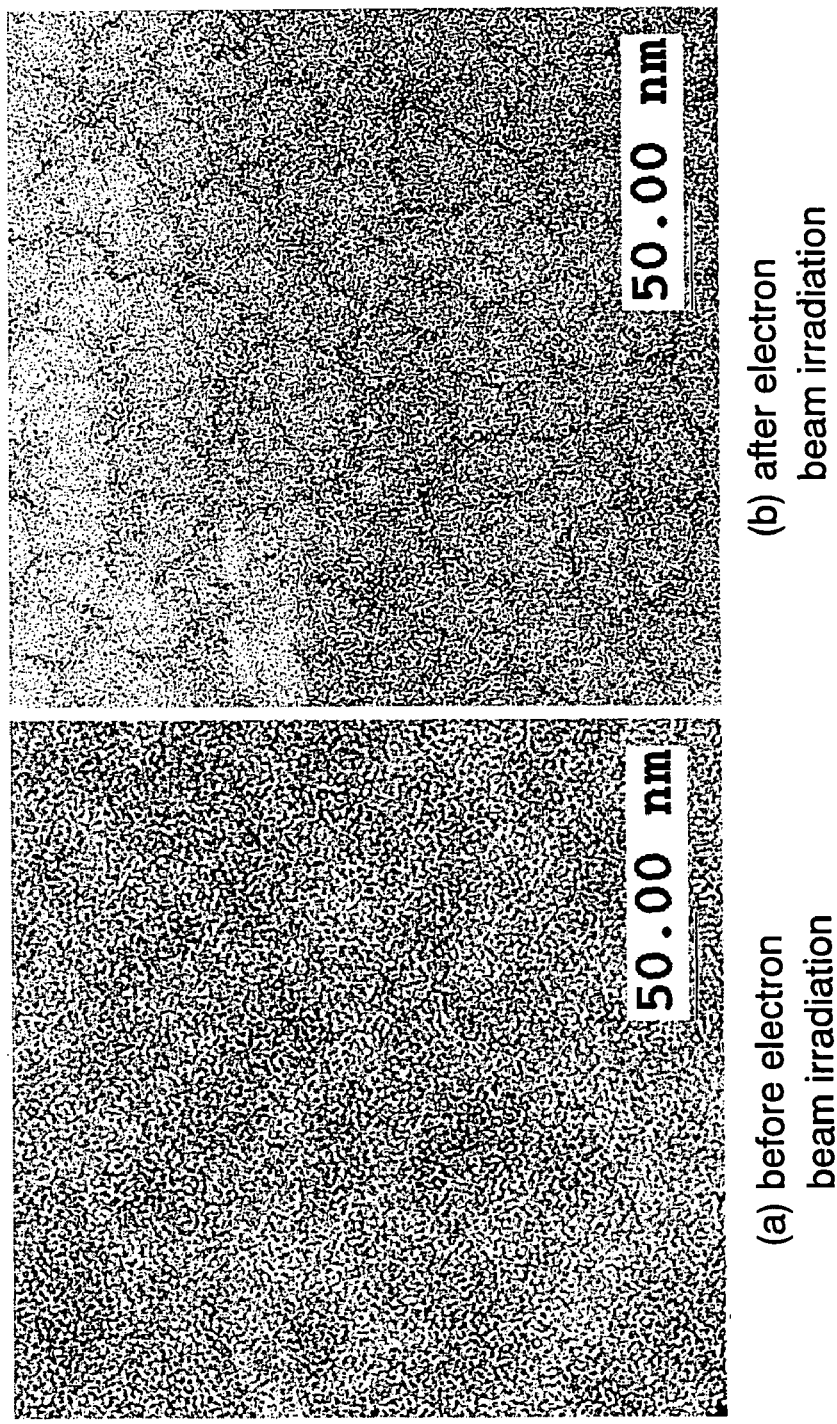
FIG. 2 are photographs showing plan-view microstructures of a) a carbon-based thin film before an electron beam irradiation and of b) a carbon-based thin film after the electron beam irradiation, being observed with a transmission electron microscope (TEM)

FIGS. 2(a) and 2(b) show states in which the thin films were observed by TEM before and after the electron beam irradiation. These photos are so-called zero-loss images in which a scattered elastic wave alone is filtered through an energy filter, and an image is formed. Before the electron beam irradiation, regions distributed like an island (first phases) are relatively dark, and an inter-island region (second phase) distributing between the first phases are relatively bright (FIG. 2(a)). This suggests that the second phase is lower in density than the first phases. According to a difference in intensity of the scattered elastic wave, the second phase is lower in density (atomic density) than the first phases by approximately 10%.

On the other hand, after the electron beam irradiation, a contrast between the first phases and the second phase was reversed (FIG. 2(b)). This suggests that the generation of a graphite structure in the second phase densified the second phase. Based on the intensity of the scattered elastic wave, the second phase is higher in density than the first phases by approximately 5%. FIG. 2(b) indicates that the average size of the first phases is approximately 50 nm in a rough calculation, an area ratio of the second phase is approximately 20%, and the spacing of the first phases adjacent to each other is approximately 10 nm.

Figure 3:
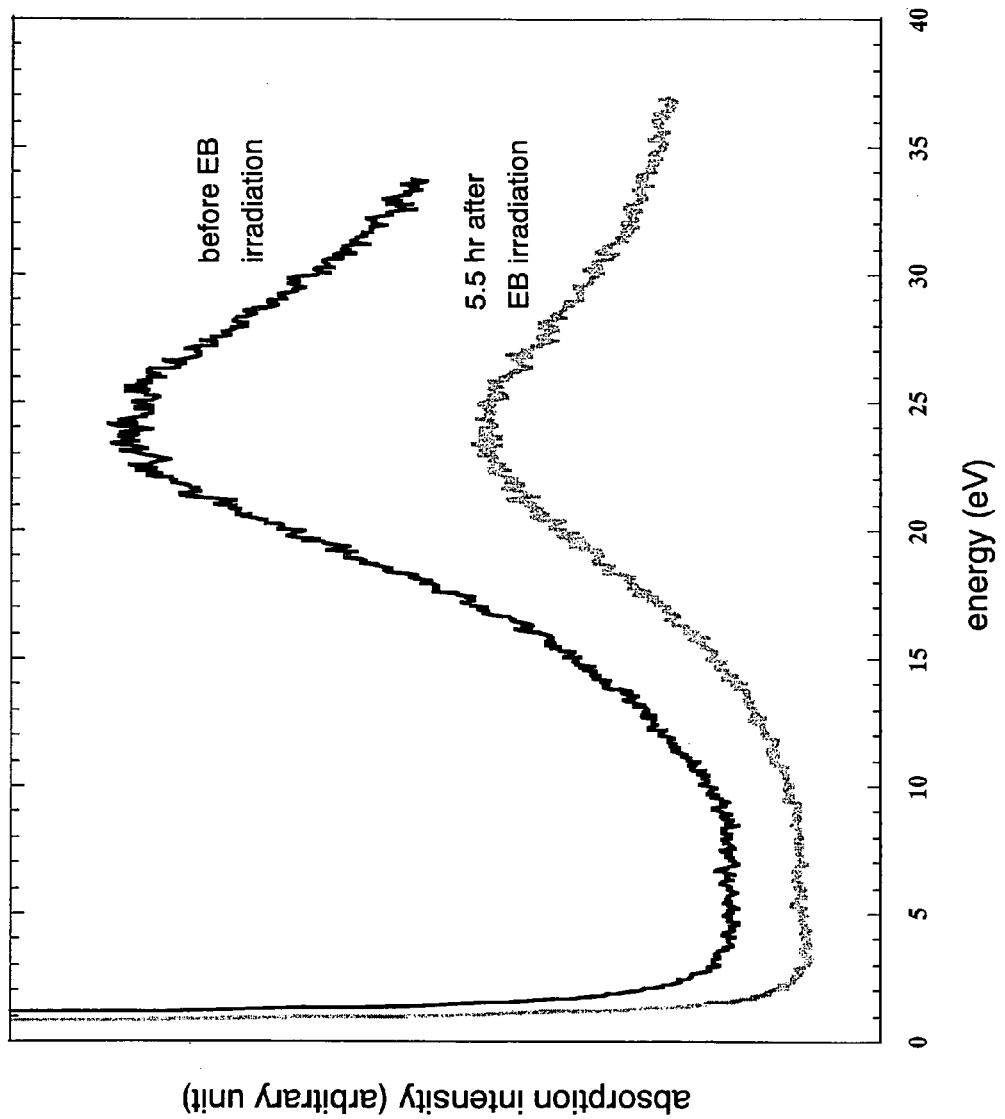
FIG. 3 are spectra measured by Low Energy Electron Energy-Loss Spectroscopy before and after an electron beam irradiation.

Before and after the electron beam irradiation, the second phase was evaluated by Low Energy Electron Energy-Loss Spectroscopy (LEELS). A resultant spectrum is shown in FIG. 3. The electron beam irradiation slightly increased a broad peak, derived from a π bonding excitation of graphite, in the vicinity of 5 eV. This suggests that the second phase was graphitized by the electron beam irradiation.

Figure 4:
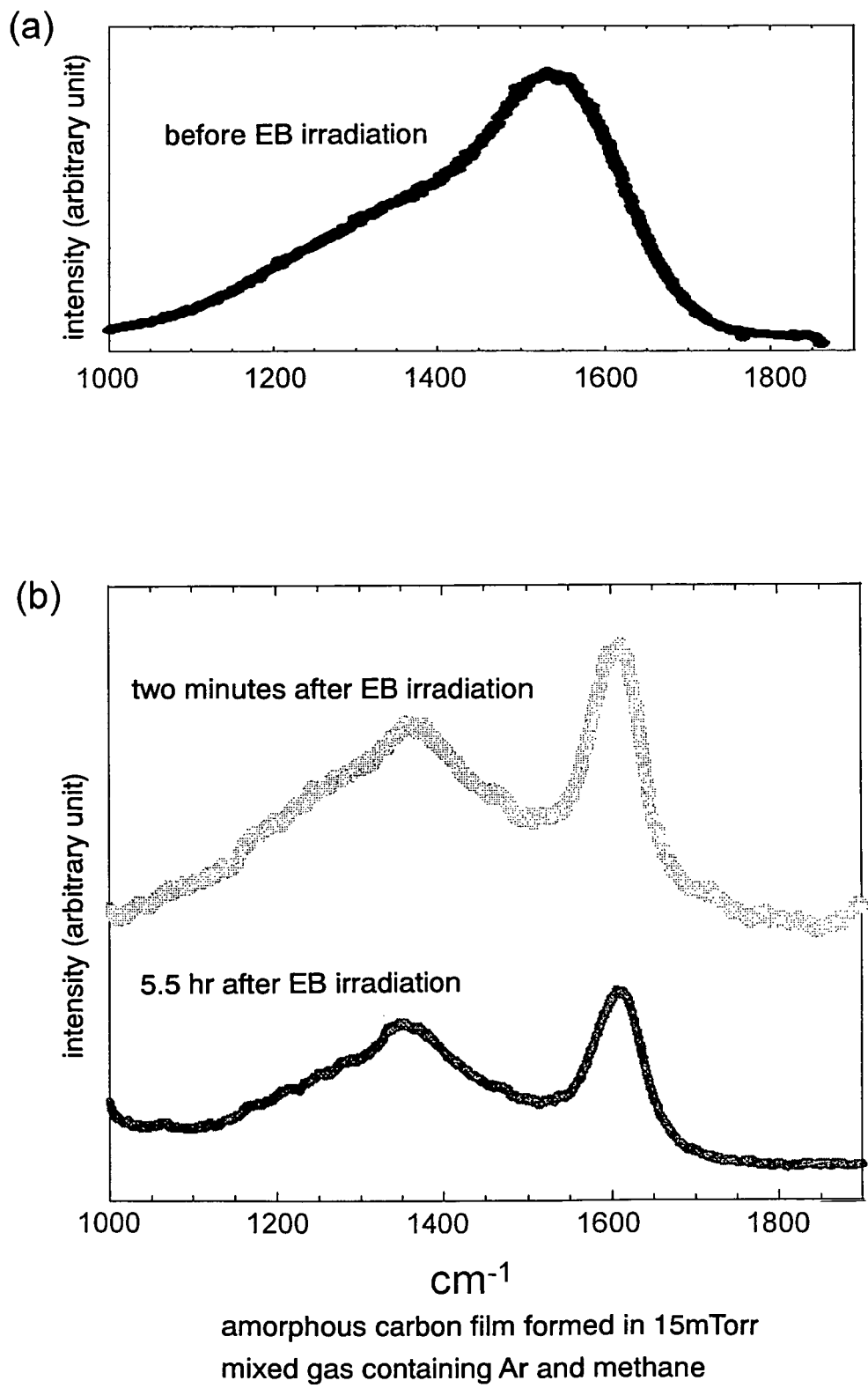
FIG. 4 are spectra of a carbon-based thin film measured by Raman Spectroscopy, a) before an electron beam irradiation, and b) after 2-minute irradiation and after 5-hour-and-30-minute irradiation.

Before and after the electron beam irradiation, the thin film was evaluated by Raman Spectroscopy. Resultant spectra are shown in FIGS. 4(a) and (b). By irradiation with the electron beam, the intensity of a D peak in the vicinity of 1360 $cm^{-1}$ and that of a G peak in the vicinity of 1600 $cm^{-1}$ increased. This suggests that the electron beam irradiation increased the graphite structure in the film.

Figure 5:
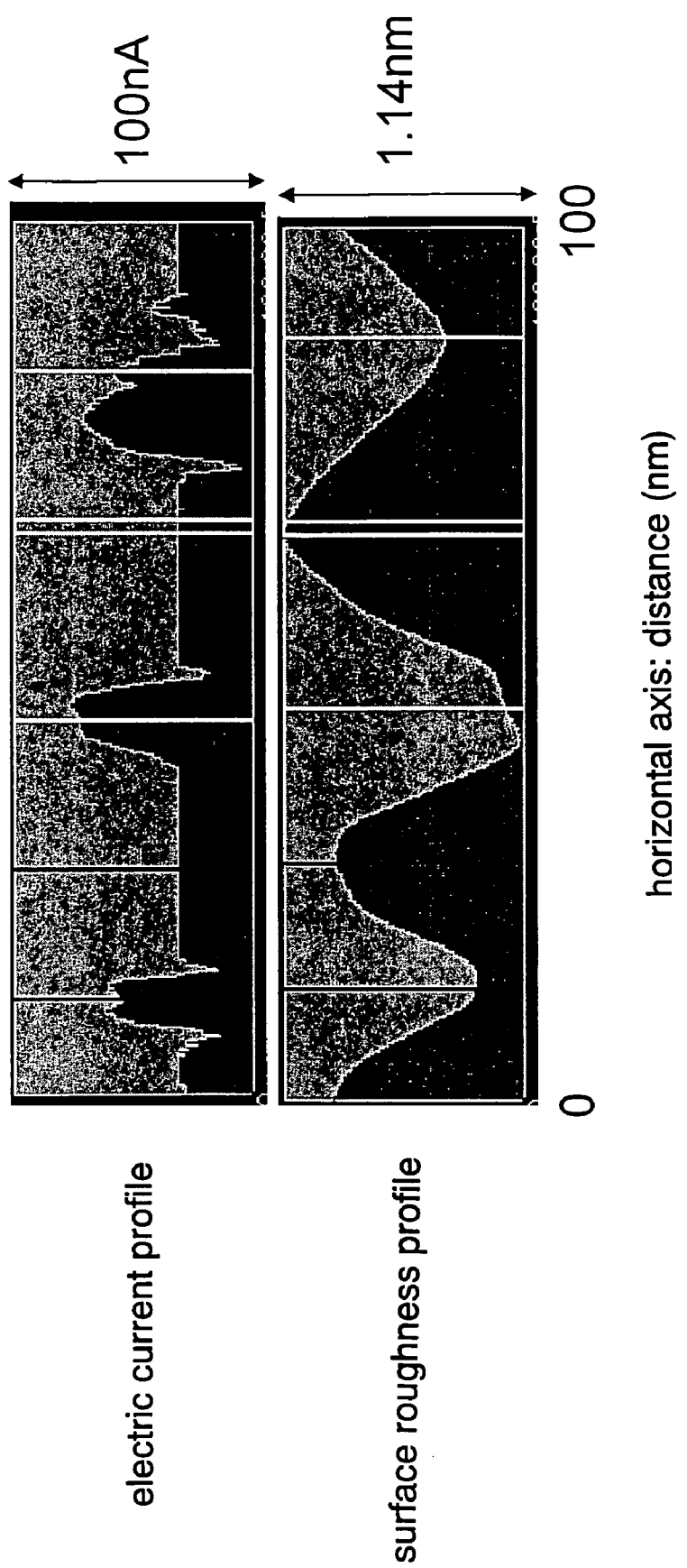
FIG. 5 are diagrams showing a surface roughness profile and an electric current profile in one example of the carbon-based thin film of the present invention.

After the electron beam irradiation, the thin film surface was evaluated for a profile with a tester and a scanning probe microscope ("SPM-9500J3" manufactured by Shimadzu Corporation). The evaluation with the scanning probe microscope was performed by using a probe (manufactured by POINTPROBE) of $n^+$-Si/$PtIr_5$ in a contact mode. In addition, upon evaluation of a current image, biased voltage of +1 to 3 V was applied to the probe. The results are shown in FIG. 5. In a surface roughness profile, a convex portion corresponds to the first phase and a concave portion corresponds to the second phase. According to a current profile, it can be confirmed that in the first phases, no electric current flows, and hence is insulating, and on the other hand, the second phase has conductivity. This corresponds to the fact that in the second phase, the graphite structure was generated.

Furthermore, results of analysis by an ERDA (Elastic Recoil Detection Analysis) method with a Rutherford back scattering measuring device and a secondary ion mass spectrometry (SIMS) regarding the carbon-based thin film formed above confirmed that the composition of this thin film was carbon 60 atom %, and hydrogen 40 atom %.

Example 2

Figure 6:
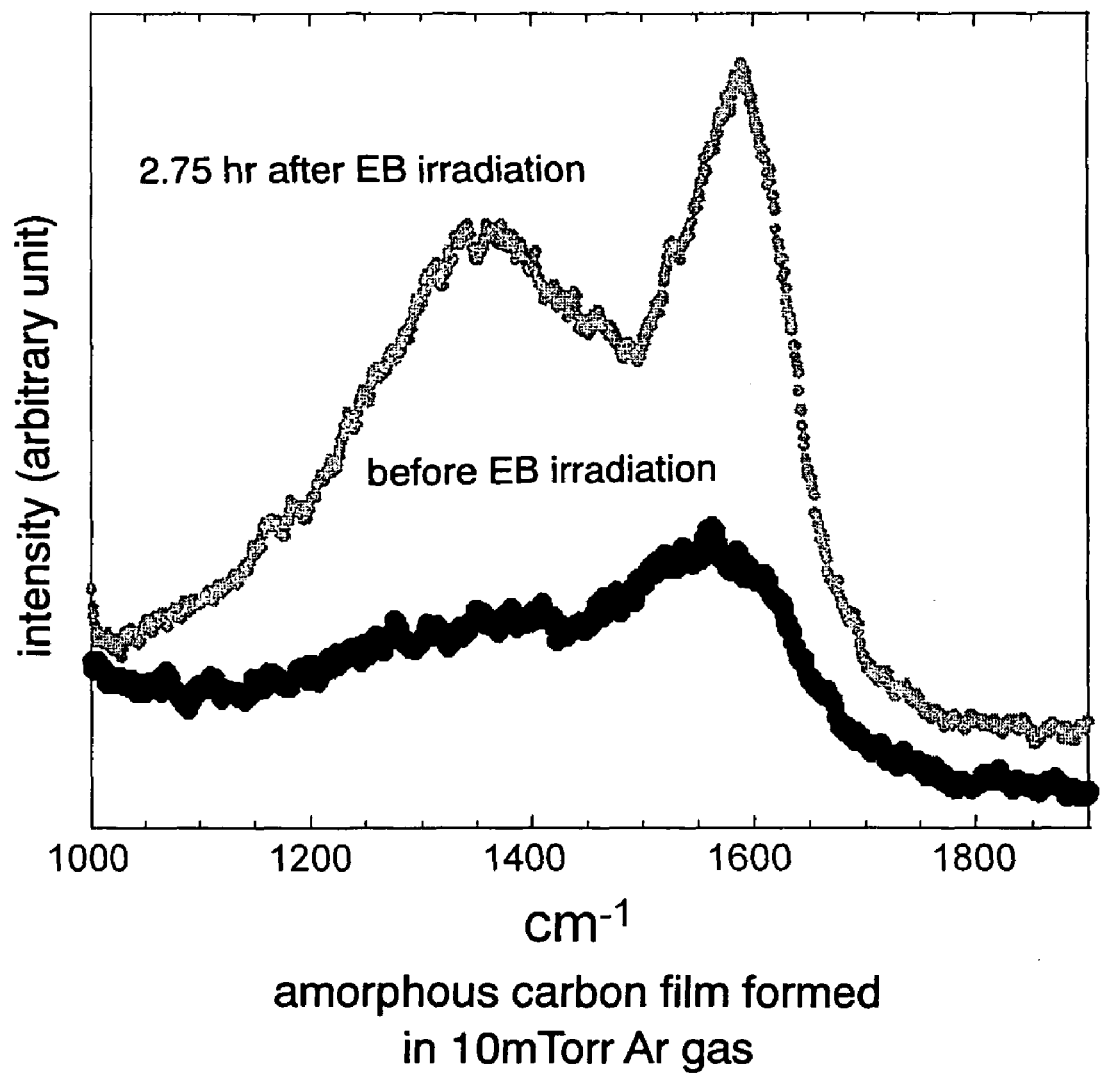
FIG. 6 are spectra of a carbon-based thin film measured by Raman Spectroscopy before and after the electron beam irradiation.

An amorphous carbon thin film was formed by the same method of Example 1 except that the film formation atmosphere is composed only of argon and the atmospheric pressure was set to 1.33 Pa (10 mTorr) before the irradiation of the electron beam. This carbon thin film produced various evaluation results similar to the above. A spectrum obtained by Raman Spectroscopy is shown in FIG. 6.

Example 3

By a magnetron sputtering method, an amorphous carbon-based thin film of approximately 0.5 μm in film thickness was formed on a silicon substrate. Pyrolytic graphite was used as a target. A substrate temperature was set at room temperature, and an atmospheric pressure was set to 4 Pa. A film formation atmosphere was a mixed gas of argon and methane. The flow ratio between argon and methane was adjusted to 2:1.

Figure 7:
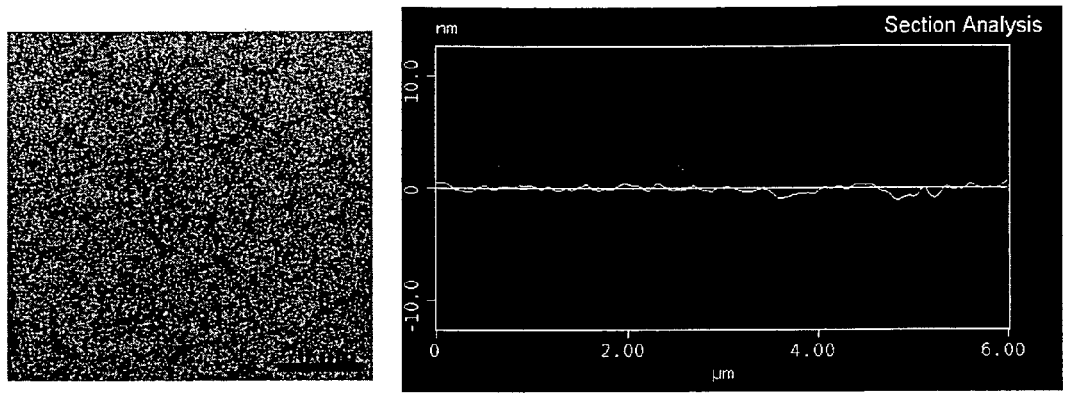
FIG. 7 shows scanning wear profiles (profiles showing the depth of ablation) of a) a carbon-based thin film after the electron beam irradiation, b) a carbon-based thin film before the electron beam irradiation, and c) a conventional amorphous carbon film (a-C film), together with the microstructures observed with a TEM.
Figure 7:
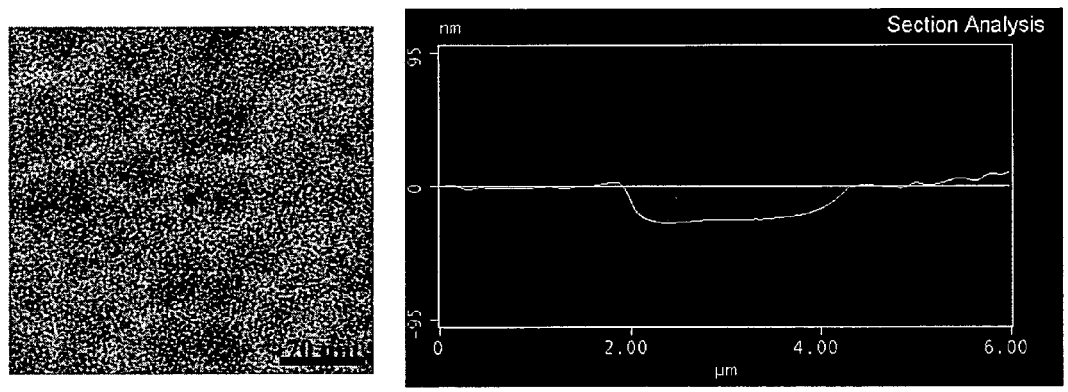
Figure 7:
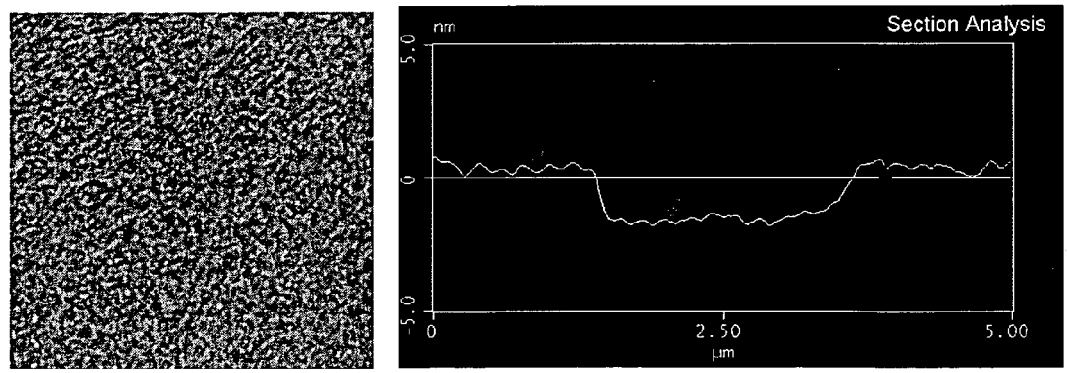

An electron beam was irradiated onto the amorphous carbon-based thin film thus obtained in the same condition as the example 1. Before and after the electron beam irradiation, a scanning wear test and a nanoindentation test were performed using an automatic indentation system ("TriboIndenter" manufactured by Hysitron Incorporated). In the scanning wear test, a squared region of 2 μm×2 μm was scanned 10 times at 10 μN, with a silicon probe. Subsequently, the scanning probe microscope ("SPM-9500J3" manufactured by Shimadzu Corporation) was used for examining the thin film surface for an unevenness image (a topographic image) and a cos image (elasticity images). The results are shown in FIG. 7.

By comparing (a) after the electron beam irradiation and (b) before the electron beam irradiation, it is confirmed that the electron beam irradiation improved the wear resistance of the thin film. For comparison, results of the scanning wear test regarding an amorphous carbon thin film (a-C film) is shown in FIG. 7(c). This a-C film was formed in a similar manner to the above except that the atmospheric pressure was set to 0.27 Pa (2 mTorr) and the film formation atmosphere was composed only of argon.

Figure 8A:
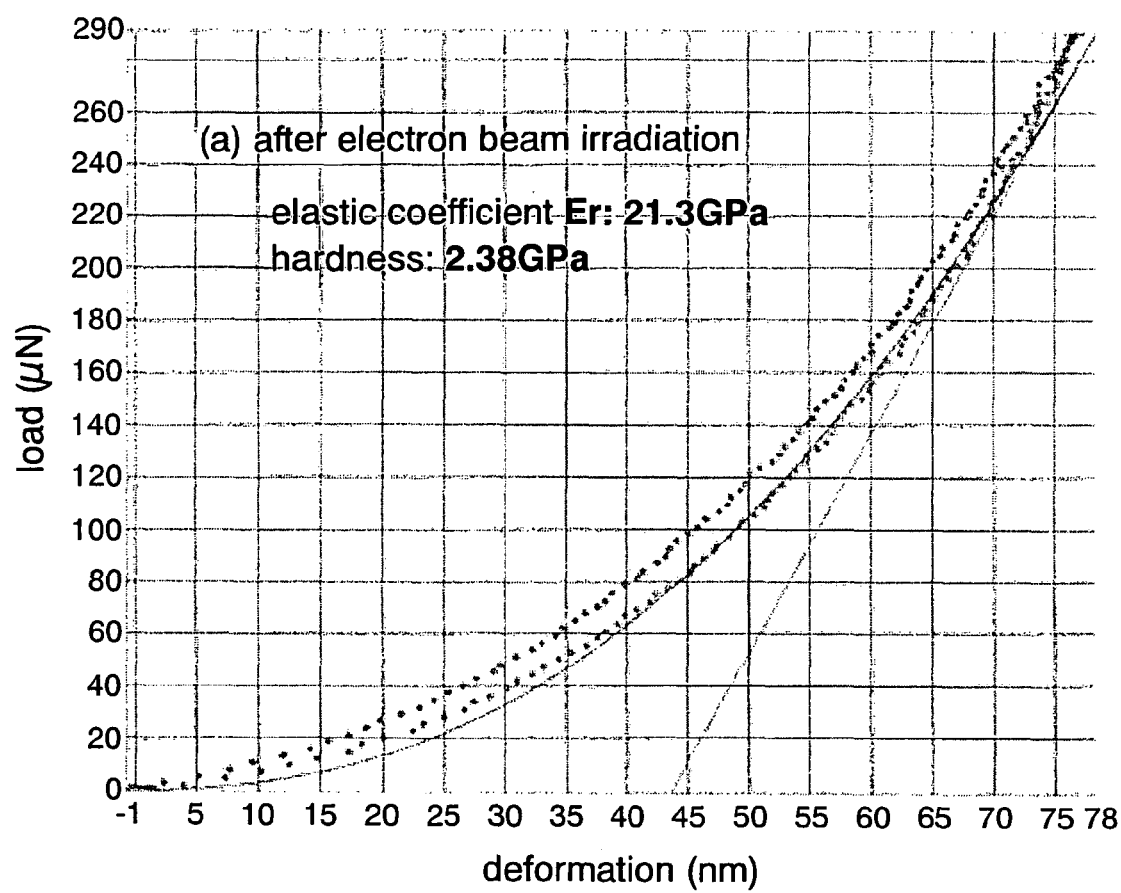
FIG. 8A is a graph showing a result of a nanoindentation test of a carbon-based thin film after an electron beam irradiation.
Figure 8B:
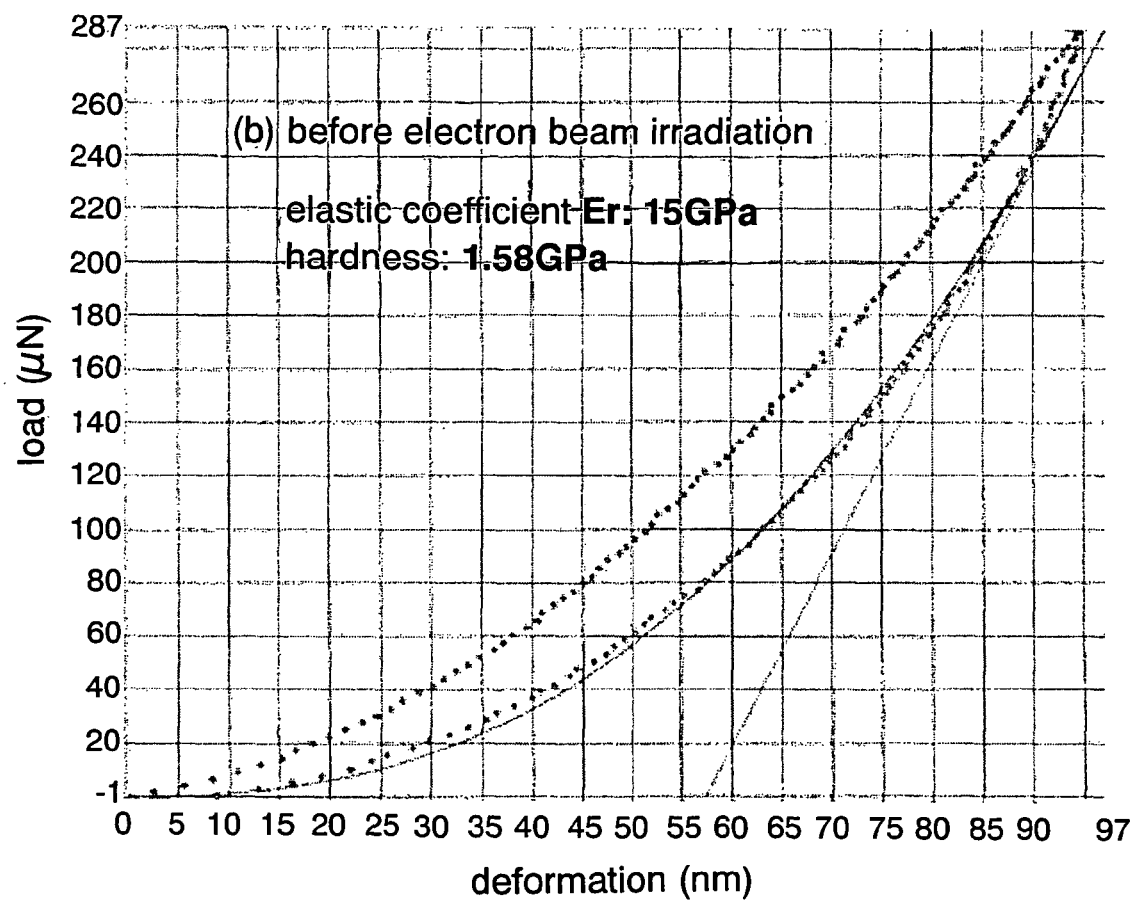
FIG. 8B is a graph showing a result of a nanoindentation test of a carbon-based thin film before an electron beam irradiation.
Figure 8C:
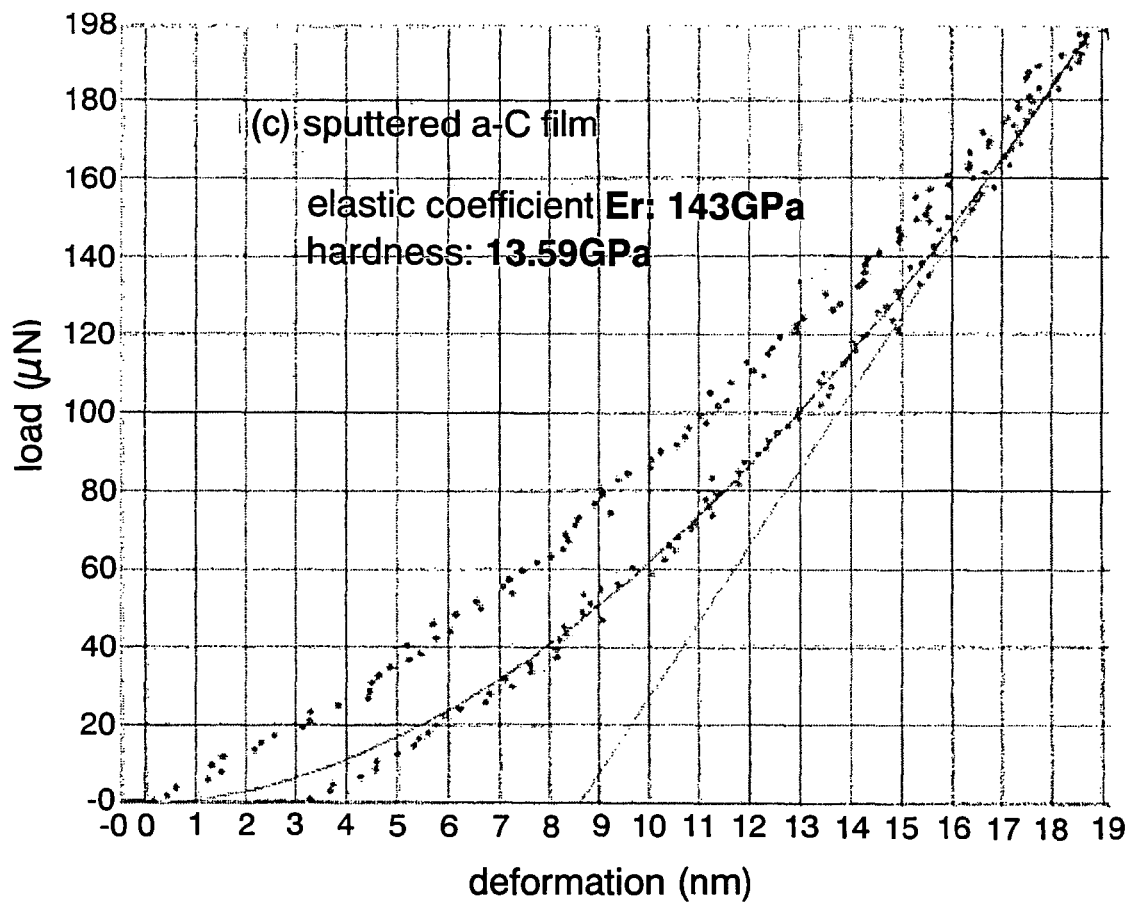
FIG. 8C is a graph showing a result of a nanoindentation test of a conventional amorphous carbon film (a-C film)

FIG. 8A to FIG. 8C show results of the nanoindentation test regarding after the electron beam irradiation (FIG. 8A), before the electron beam irradiation (FIG. 8B), and the a-C film (FIG. 8C). These results show that the electron beam irradiation slightly improved the hardness of the thin film, and that the hardness of the thin film is low even after the electron beam irradiation, referring to the hardness (see FIG. 8C) of a standard amorphous carbon thin film (a-C film), while an elasticity recovery rate is very high. It is not a hardening of the film, but an elastic property of the film that improved the wear resistance (FIG. 7). This property probably is derived from the formation of the graphite structure by the electron beam irradiation, more specifically, a formation in which the basal plane is oriented in the film thickness direction. Because, as understood from the fact that the graphite is generally used as a self lubricant agent, even when the graphite is formed and yet its basal plane is inside the in-plane, the graphite is easily deformed because of a weak bonding among the basal surface, thereby preventing a high wear property as exhibited in the present invention from appearing.

Figure 9:
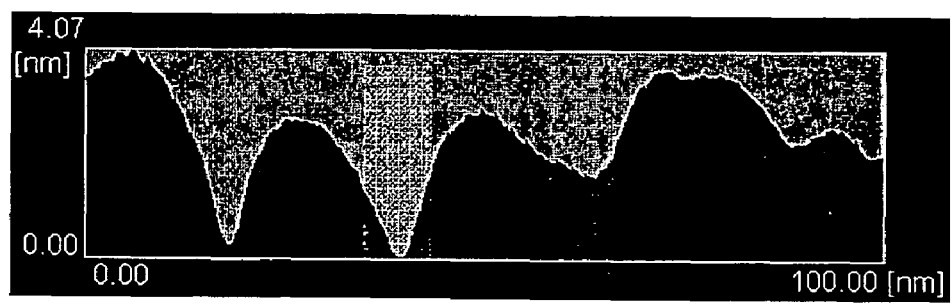
FIG. 9 are diagrams showing (a) unevenness of a carbon-based thin film after an electron beam irradiation, and (b) a cos image detected therefrom.
Figure 9:
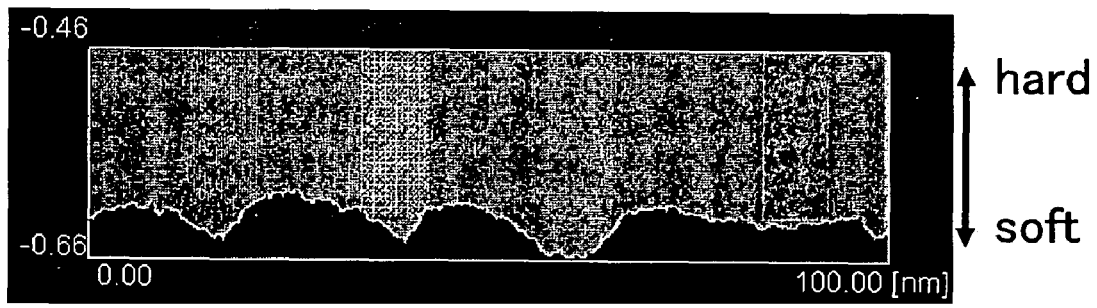
Figure 10:
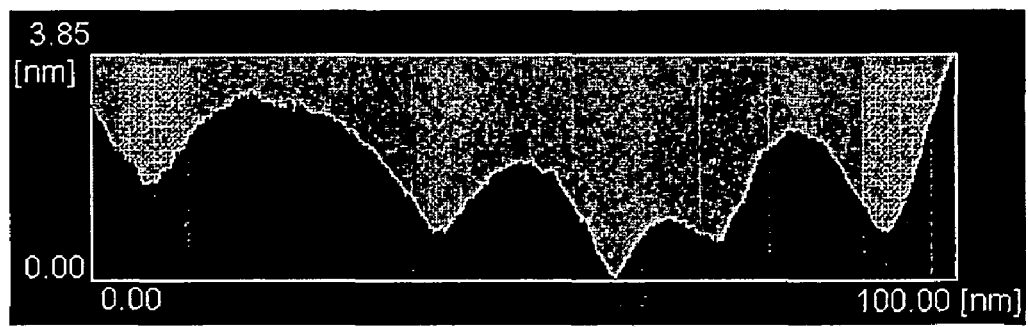
FIG. 10 are diagrams showing (a) unevenness of a carbon-based thin film before an electron beam irradiation, and (b) a cos image detected by portions therefrom.
Figure 10:
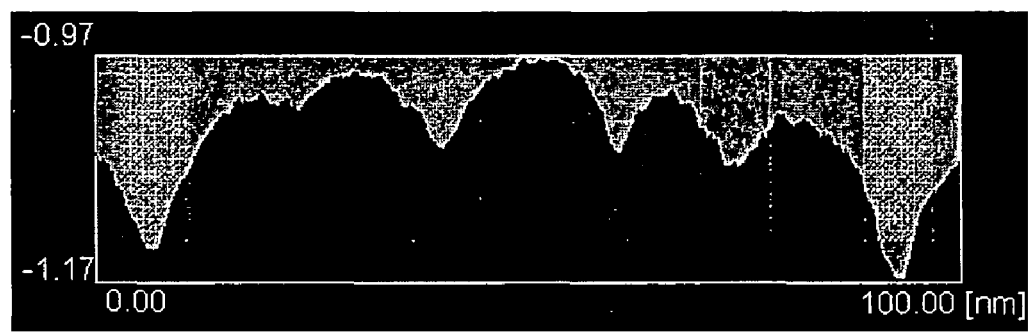

FIG. 9 shows (a) unevenness on the thin film surface after the electron beam irradiation and (b) a cos image detected in portions corresponding thereto. In addition, for comparison, FIG. 10 shows (a) unevenness on the thin film surface before the electron beam irradiation and (b) a cos image detected in portions corresponding thereto. A convex portion corresponds to the column region (first phase) and a concave portion corresponds to the intercolumn region (second phase), respectively. When the cos images before and after the electron beam irradiation are compared, it can be confirmed that the electron beam irradiation is dissolving a difference in intensity in the cos images of the two phases. When the influence of the unevenness on the surface is taken into consideration, these cos images indicate that by the electron beam irradiation, the elastic modulus in the intercolumn region (second phase) exceeds that in the column region (first phase).

Example 4

An amorphous carbon-based thin film was formed on this substrate by the same method of Example 2 except that an aluminosilicate glass plate (1737 manufactured by Corning) was used as a substrate. The electron beam was irradiated to this thin film.

Prior to the electron beam irradiation, an Ni plate of 200 μm in thickness was arranged as a template on the amorphous carbon-based thin film. The electron beam was irradiated onto a portion of the amorphous carbon-based thin film.

Figure 15:
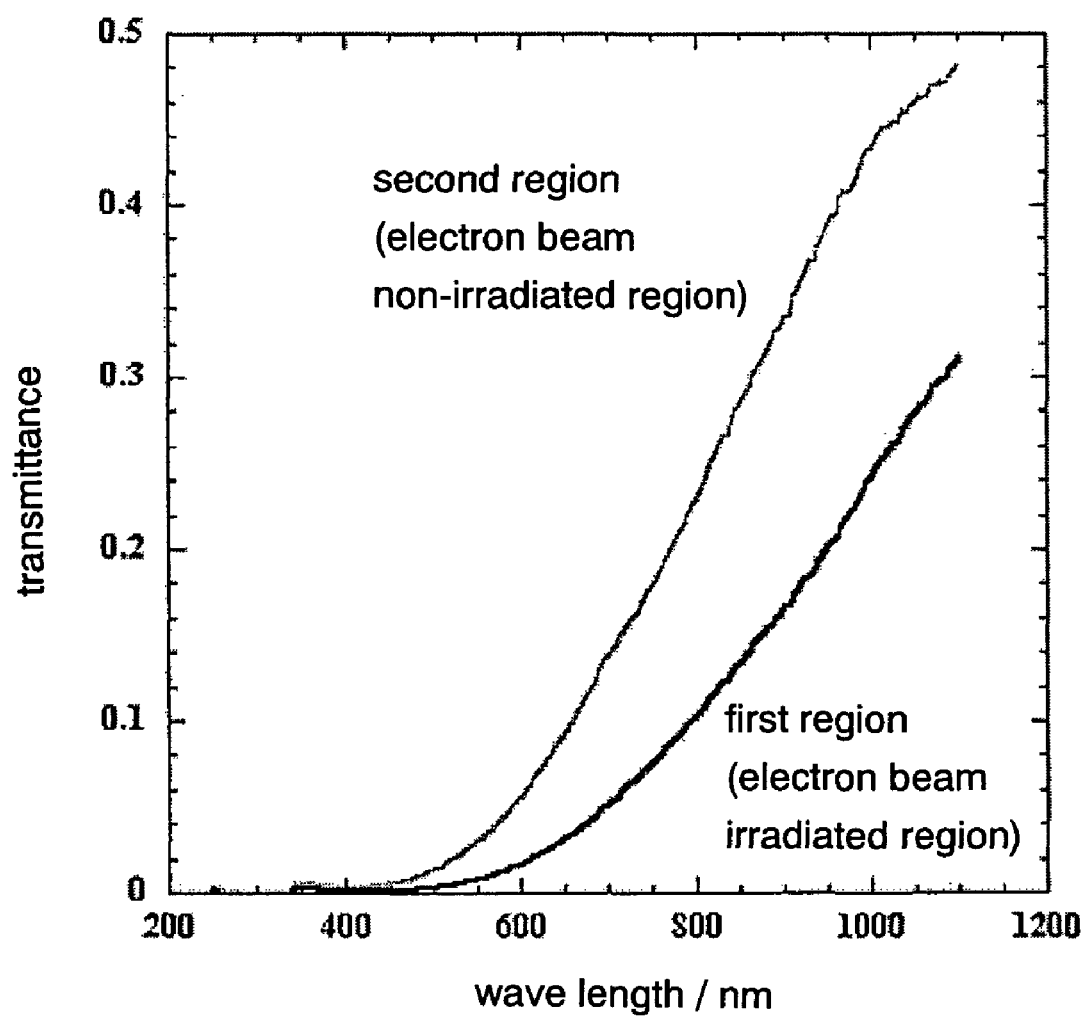
FIG. 15 shows spectral transmittance curves from a visible range to a near-infrared range in an electron beam irradiation region (first region) and an electron beam non-irradiation region (second region)

An electron beam irradiated region (first region) and a non-irradiated region (second region) of the carbon-based thin film thus obtained were evaluated for the light transmittance from an ultraviolet range to a near-infrared range (wavelength range of 250 nm to 1100 nm) with a spectroscopic ellipsometry (VB-400 manufactured by J. A. Woollam. Co., Inc, a high-speed monochrometer system HS-190 attached). The results are shown in FIG. 15. The transmittance in the first region from a visible range to a near-infrared range was lower than that in the second region. When this result and structural differences in the two regions are taken into consideration, it can be understood that the first region has a lower transmittance than the second region even in a far-infrared range of approximately 2 μm in wavelength, for example.

In addition, the above-described various evaluations were performed by comparing the intercolumn textures in the electron beam irradiated region and in the electron beam non-irradiated region. It was confirmed that the intercolumn phase (second phase) in the electron beam irradiated region had more graphite structures per unit volume, was larger in density, lower in electric resistivity, higher in elastic modulus than the intercolumn phase (fourth phase) in the electron beam non-irradiated region.

INDUSTRIAL APPLICABILITY

According to the present invention, a carbon-based thin film having a characteristic minute structure in which phases different in electrical, optical, and mechanical properties extend along the thickness direction can be provided. This thin film has a property applicable to various devices, for example, an interlayer insulation film in which a conductor penetrates in the thickness direction, for example. In addition, since the carbon-based thin film of the present invention can be provided with elastic and excellent wear resistance, this film also is effective as a coating film (protective film), particularly in application requiring excellent durability against a trace ablation by a small load. Furthermore, in the carbon-based thin film of the present invention, regions different in optical property can be arranged, and thus, the present invention also can be applicable to various kinds of optical devices.

The invention claimed is:

1. A process for producing a carbon-based thin film that consists of carbon or of carbon and at least one selected from a group consisting of hydrogen, nitrogen, boron and silicon, the process comprising the following steps of:
   forming an amorphous carbon-based thin film that includes columnar first phases extending in a film thickness direction, and a second phase intervening between the first phases so that an amount of a graphite structure per unit volume in the second phase is smaller than that in the first phases and so that a density of the second phase is lower than that of the first phases; and
   after forming the amorphous carbon-based thin film, forming a graphite structure at least in the second phase by supplying energy to the amorphous carbon-based thin film so that the amount of the graphite structure per unit volume in the second phase is larger than that in the first phases, so that the density of the second phase is higher than that of the first phases and so that in the second phase, a basal plane of the graphite structure is oriented along the film thickness direction, wherein the amorphous carbon-based thin film is supplied with the energy by an electron beam irradiation with an intensity of $1\times10^{17}/cm^2\cdot sec$ or less.

2. The process for producing a carbon-based thin film according to claim 1, wherein the amorphous carbon-based thin film is formed by a vapor phase deposition method.

3. The process for producing a carbon-based thin film according to claim 2, wherein the amorphous carbon-based thin film is formed by a physical vapor deposition method, and the deposition method satisfies at least one of a condition A that a substrate temperature is 773 K or less and a condition B that an atmospheric pressure is 1.33 Pa or more.

4. The process for producing a carbon-based thin film according to claim 2, wherein the amorphous carbon-based thin film is formed in an atmosphere containing at least one selected from the group consisting of a hydrogen atom-containing gas and a nitrogen atom-containing gas.

5. The process for producing a carbon-based thin film according to claim 1, wherein the amorphous carbon-based thin film is formed so that a density of the second phase is lower than that of the first phases and that a structural change of the second phase by supplying energy to the amorphous carbon-based thin film is made more easily to occur than the structural change of the first phases.

6. The process for producing a carbon-based thin film according to claim 1, wherein energy is supplied so that at least one selected from the group consisting of the following a) to d) is satisfied:
   a) the second phase contains more graphite structures per unit volume than the first phases;
   b) a density of the second phase is larger than that of the first phases;
   c) an electric resistivity of the second phase is lower than that of the first phases; and
   d) an elastic modulus of the second phase is higher than that of the first phases.

7. The process for producing a carbon-based thin film according to claim 1, wherein the amorphous carbon-based thin film is formed so that the second phase forms a network between the first phases.

8. The process for producing a carbon-based thin film according to claim 1, wherein the energy is supplied only to a portion of the amorphous carbon-based thin film.

9. The process for producing a carbon-based thin film according to claim 8, wherein an electron beam is irradiated onto a surface of the amorphous carbon-based thin film in a state that the surface is partially masked.

* * * * *